(12) United States Patent
Meldrim et al.

(10) Patent No.: US 10,731,273 B2
(45) Date of Patent: Aug. 4, 2020

(54) SOURCE MATERIAL FOR ELECTRONIC DEVICE APPLICATIONS

(71) Applicant: Micron Technology, Inc., Boise, ID (US)

(72) Inventors: John Mark Meldrim, Boise, ID (US); Yushi Hu, Boise, ID (US); Yongjun Jeff Hu, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/436,501

(22) Filed: Jun. 10, 2019

(65) Prior Publication Data

US 2019/0360120 A1    Nov. 28, 2019

Related U.S. Application Data

(62) Division of application No. 14/989,097, filed on Jan. 6, 2016, now Pat. No. 10,344,398.

(60) Provisional application No. 62/101,138, filed on Jan. 8, 2015.

(51) Int. Cl.
| | |
|---|---|
| *C30B 29/38* | (2006.01) |
| *H01L 27/11556* | (2017.01) |
| *H01L 29/792* | (2006.01) |
| *H01L 27/11582* | (2017.01) |
| *C30B 23/02* | (2006.01) |
| *C30B 25/02* | (2006.01) |
| *H01L 21/225* | (2006.01) |
| *H01L 27/11524* | (2017.01) |
| *H01L 27/1157* | (2017.01) |

(52) U.S. Cl.
CPC .............. *C30B 29/38* (2013.01); *C30B 23/02* (2013.01); *C30B 25/02* (2013.01); *H01L 21/2257* (2013.01); *H01L 27/1157* (2013.01); *H01L 27/11524* (2013.01); *H01L 27/11556* (2013.01); *H01L 27/11582* (2013.01); *H01L 29/7926* (2013.01)

(58) Field of Classification Search
CPC ................................................. H01L 27/11524
See application file for complete search history.

(56) References Cited

U.S. PATENT DOCUMENTS

| 5,747,361 A * | 5/1998 | Ouellet ............... H01L 23/5226 257/E23.145 |
| 6,240,199 B1 * | 5/2001 | Manchanda ............ G01D 5/24 382/124 |
| 9,166,032 B1 | 10/2015 | Higuchi et al. |

(Continued)

*Primary Examiner* — Eugene Lee
(74) *Attorney, Agent, or Firm* — Schwegman Lundberg & Woessner, P.A.

(57) ABSTRACT

Various embodiments include methods and apparatuses comprising methods for formation of and apparatuses including a source material for electronic devices. One such apparatus includes a vertical string of memory cells comprising a plurality of alternating levels of conductor and dielectric material, a semiconductor material extending through the plurality of alternating levels of conductor material and dielectric material, and a source material coupled to the semiconductor material. The source material includes a titanium nitride layer and a source polysilicon layer in direct contact with the titanium nitride layer. Other methods and apparatuses are disclosed.

19 Claims, 6 Drawing Sheets

(56) References Cited

U.S. PATENT DOCUMENTS

| | | | |
|---|---|---|---|
| 10,344,398 B2 | 7/2019 | Meldrim et al. | |
| 2009/0206393 A1* | 8/2009 | Ariyoshi | H01L 29/4234 257/326 |
| 2009/0267135 A1 | 10/2009 | Tanaka et al. | |
| 2013/0270621 A1* | 10/2013 | Mori | H01L 29/78 257/314 |
| 2013/0313627 A1* | 11/2013 | Lee | H01L 21/76816 257/324 |
| 2015/0179660 A1 | 6/2015 | Yada et al. | |
| 2015/0270165 A1* | 9/2015 | Hyun | H01L 21/76843 257/329 |
| 2015/0318295 A1* | 11/2015 | Kai | H01L 27/11556 257/319 |
| 2016/0071861 A1* | 3/2016 | Serov | H01L 27/11556 365/185.19 |
| 2016/0104717 A1* | 4/2016 | Lu | G11C 16/0483 365/185.22 |
| 2016/0118397 A1 | 4/2016 | Koka et al. | |
| 2016/0181264 A1 | 6/2016 | Miyamoto et al. | |
| 2016/0204205 A1 | 7/2016 | Meldrim et al. | |

* cited by examiner

SOURCE MATERIAL FOR ELECTRONIC DEVICE APPLICATIONS

PRIORITY APPLICATION

This application is a divisional of U.S. application Ser. No. 14/989,097, filed Jan. 6, 2016, which claims the benefit of priority to U.S. Provisional Application Ser. No. 62/101,138, filed Jan. 8, 2015, both of which are incorporated herein by reference in their entireties.

BACKGROUND

Memory devices are frequently provided as internal, semiconductor integrated circuits in computers and other electronic devices. The memory devices may be arranged in strings of memory cells where each string may be coupled to a heavily doped semiconductor region from which majority carriers may flow into a channel associated with the memory devices. The heavily-doped region is typically referred to as a "source." Groups of strings of memory cells (e.g., memory blocks) may all be coupled to a common source.

When a memory manufacturer desires to increase density of a memory device, additional groups of strings of memory cells may be added to the memory device and coupled to the common source. Consequently, the common source may be increased in length, thereby increasing the resistance of the source.

In many applications, it is desirable to keep a resistance level of the source as low as possible since, as is known in the art, a larger resistance may cause a larger voltage drop from a particular point of the circuit to the common source. A larger voltage drop can cause problems during memory operations in which the memory operations rely on smaller voltage differences.

DETAILED DESCRIPTION

Figure 1:
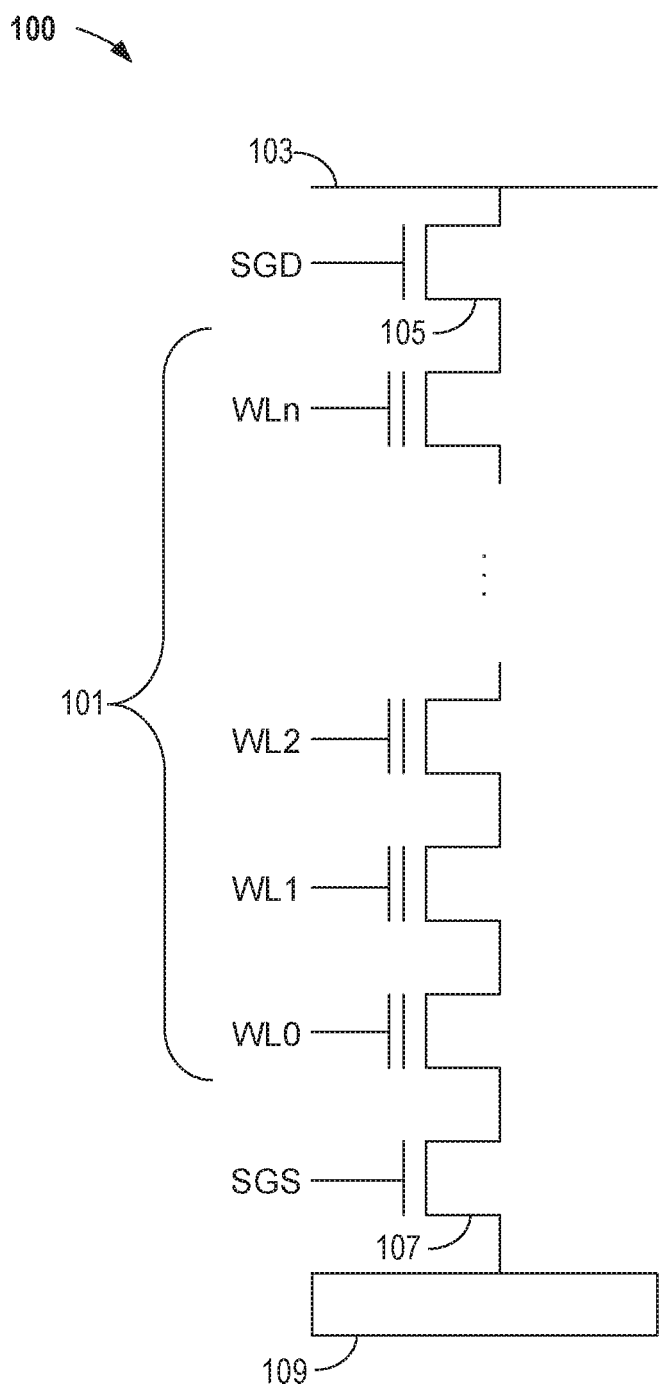
FIG. 1 shows a schematic diagram of a string of memory cells, according to an embodiment.

The description that follows includes illustrative apparatuses (e.g., circuitry, devices, structures, and systems) and methods (e.g., fabrication processes, techniques, materials, and technologies) that embody the disclosed subject matter. In the following description, for purposes of explanation, numerous specific details are set forth in order to provide an understanding of various embodiments of the inventive subject matter. It will be evident, however, to those of ordinary skill in the art that various embodiments of the inventive subject matter may be practiced without these specific details. Further, well-known instruction instances, protocols, structures, fabrication technologies, materials, and techniques have not been shown in detail, so as not to obscure the various illustrated embodiments.

As used herein, the term "or" may be construed in an inclusive or exclusive sense. Additionally, although various exemplary embodiments discussed below focus on a three-dimensional (3D) NAND memory device, the embodiments are merely given for clarity in disclosure, and thus, are not limited to NAND memory devices or even to memory devices in general. As an introduction to the subject, a few embodiments will be described briefly and generally in the following paragraphs, and then a more detailed description, with reference to the figures, will ensue.

One disclosed method of fabrication, and a resulting apparatus, has an architecture comprising a stacked 3D structure coupled to a source. The structure may be used to form, for example, strings of memory cells. The disclosed structure can utilize all functions developed, for example, with respect to planar NAND logic or other types of electronic devices.

The inventive subject matter incorporates a novel use of a titanium nitride (TiN) layer formed to have a high density and low resistivity. The TiN layer could be used to replace conventional tungsten silicide ($WSi_x$ or WSix) layers currently being utilized as a source material in various semiconductor processes. The lower resistivity of the TiN layer allows for a lower resistance and/or capacitance path to the source. Additionally, the TiN layer acts as a barrier for dopant migration, thus keeping dopants from migrating from a doped polysilicon region to another region to which the TiN layer is electrically coupled. Finally, adhesion with other layers is increased and an unwanted formation of oxide layers is reduced through the use of the disclosed TiN layer. More complete details regarding use and formation of the novel TiN layer are now provided.

In the following detailed description, reference is made to the accompanying drawings that form a part of the application hereof and in which is shown, by way of illustration, specific embodiments. In the drawings, like numerals describe substantially similar components throughout the several views. Other embodiments may be utilized and, for example, various structural, logical, and electrical changes may be made without departing from the scope of the present disclosure. The following detailed description is, therefore, is to be taken in an illustrative sense rather than in a limiting sense.

FIG. 1 shows a schematic diagram of a string 100 of memory cells. For purposes of illustration only, the string 100 is shown to have n individual memory cells 101, arranged in a column along with access lines (e.g., wordlines to conduct signals on lines WL0 through WLn). Alternate embodiments can include more or less than n memory cells 101. The string 100 can include a source select gate transistor 107. The source select gate transistor 107 may include, for example, an n-channel transistor, coupled between a lower one of the memory cells 101, at a first end of the string 100, and a common source 109. The common source 109 may comprise, for example, a slot or other region of commonly doped semiconductor material (e.g., a doped polysilicon) and/or other conductive material. At a second end of the string 100, a drain select gate transistor 105 may include, for example, an n-channel transistor coupled between an upper one of the memory cells 101 and a data line 103 (e.g., a bit line to conduct signals).

Each of the memory cells 101 may comprise, for example, a floating gate transistor. In other embodiments, each of the memory cells 101 may comprise a charge trap transistor. Either configuration may include a single level charge storage device or a multi-level charge storage device. The memory cells 101, the source select gate transistor 107, and the drain select gate transistor 105 are controlled by signals on their respective control gates, the signals being provided on access lines (e.g., word lines) WL0-WLn, source select line SGS, and drain select line SGD. In various embodiments, the control gates of memory cells in a row (not shown) of memory cells 101 can form part of an access line.

The source select gate transistor 107 receives a control signal on the SGS line that controls the source select gate transistor 107 to substantially control conduction between the string 100 and the common source 109. The drain select gate transistor 105 receives a control signal on the SGD line that controls the drain select gate transistor 105, such that the drain select gate transistor 105 can be used to select or deselect the string 100.

The string 100 can be one of multiple strings of memory cells 101 in a block of memory cells in a memory device, such as a NAND-architecture flash memory device. Each string 100 of the memory cells 101 may be formed vertically such that they extend outward, away from a substrate, as opposed to extending in a planar manner, along the surface plane of the substrate.

A person of ordinary skill in the art will recognize that a memory device may include other components, at least some of which are discussed herein. However, several of these components or structures are not necessarily shown in FIG. 1, so as not to obscure the various embodiments described herein.

Figure 2A:
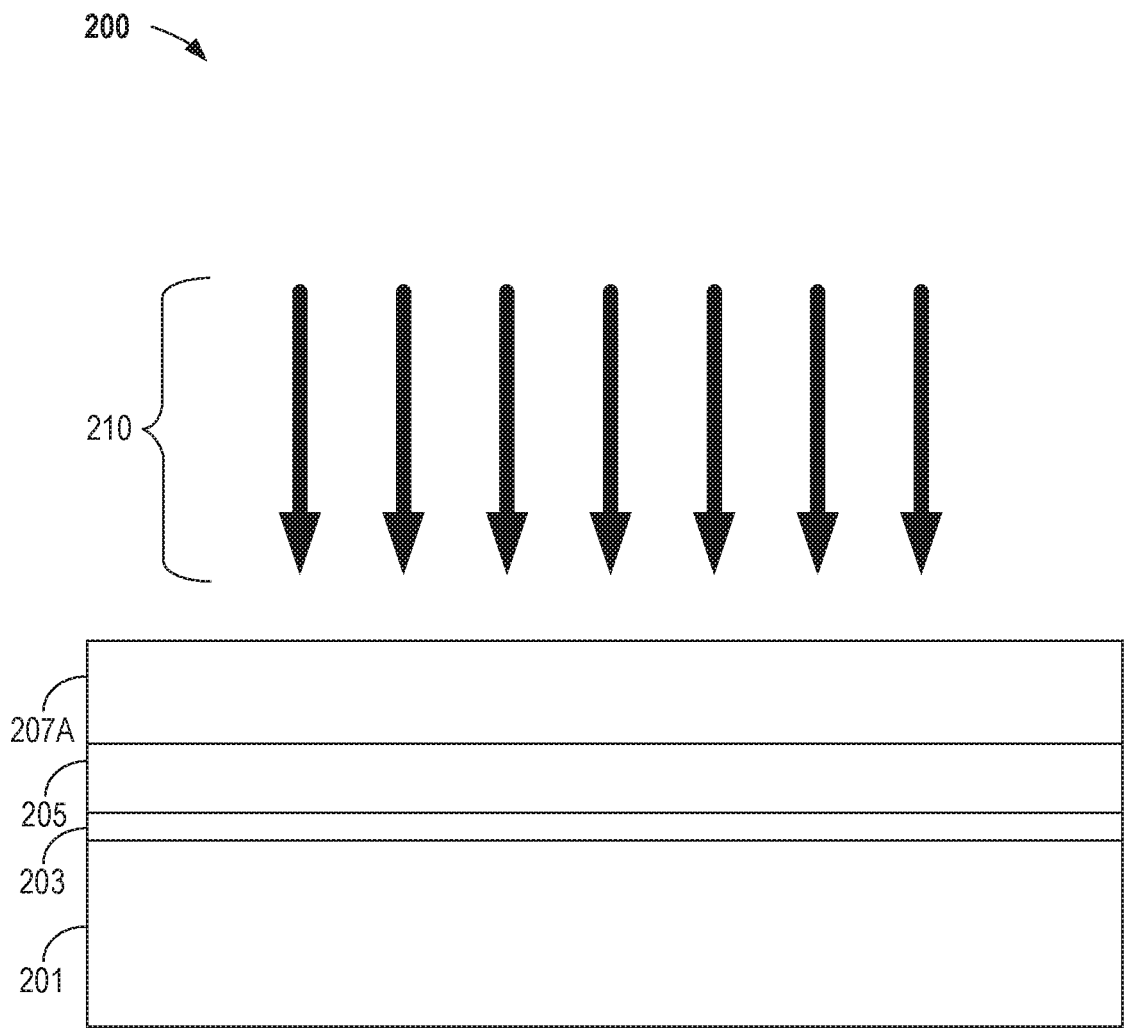
FIGS. 2A and 2B show examples of cross-sectional diagrams of prior art memory cell stack formation and an associated source and channel.

Referring now to FIG. 2A, an example of a cross-sectional diagram 200 of prior art memory cell stack formation and an associated source and channel structures are shown. The cross-sectional diagram 200 illustrates conventional methods of fabrication for forming a vertical string of memory cells. Although other formation and fabrication methods may be employed, those given below are provided merely to aid the person of ordinary skill in the art in understanding the disclosed subject matter. Prior art fabrication techniques frequently employ a tungsten silicide/polysilicon stack, described below, for the vertical NAND source.

FIG. 2A is shown to include a source material layer 201 formed over a substrate (not shown). The source material layer 201 acts as a metal source material. A dielectric material layer 203 may be formed (or naturally grown as is the case with a native oxide) over the source material layer 201. A source polysilicon layer 205 is formed over the dielectric material layer 203 to provide a dopant reservoir for a later-formed channel polysilicon (discussed with reference to FIG. 2B, below). A capping material layer 207A may be formed over the source polysilicon layer 205.

The source material layer 201 may include various types of metal silicide such as tungsten silicide ($WSi_x$). For example, the metal silicide may include at least one of tungsten silicide ($WSi_x$), tantalum silicide ($TaSi_x$), or molybdenum silicide ($MoSi_x$). The source material layer 201 is commonly selected to include a transition metal that may be combined with a semiconductor material, forming, for example, an inorganic compound. In a specific exemplary embodiment, tungsten disilicide ($WSi_2$), or more generally, tungsten silicide ($WSi_x$) may be formed as the source material layer 201 from, for example, using source gases of tungsten hexafluoride ($WF_6$) and monosilane ($SiH_4$) or dichlorosilane ($H_2SiCl_2$) in a chemical vapor deposition (CVD) process. The resulting $WSi_x$ film may subsequently be annealed to form a more conductive, stoichiometric form. In this example, the $WSi_x$ film used to form the source material layer 201 is a relatively hard material and thus also forms an etch stop.

With continuing reference to FIG. 2A, the source polysilicon layer 205 can be doped in a doping process 210 in order to alter electrical properties of the source polysilicon layer 205, as desired. For example, acceptor or donor atoms from Groups III and V, respectively, of the periodic table may be used in the doping process 210 to dope the source polysilicon layer 205 to form a p-type or an n-type conductive material. For example, Group III elements, such as boron, may be used to form a p-type conductive material. Group V elements, such as phosphorus, may be used to form an n-type conductive material.

The capping material layer 207A may include an oxide material (e.g., silicon dioxide ($SiO_2$)), a polysilicon material, or some other capping material used, for example, for sealing pores in the source polysilicon layer 205. If the capping material layer 207A is an oxide, the oxide may be used as a source select gate oxide for a source select gate transistor, such as the source select gate transistor 107 shown in FIG. 1.

As noted above, conventional semiconductor fabrication techniques may result in a tungsten silicide/polysilicon stack for the vertical NAND source. The polysilicon portion provides a reservoir of dopant species to diffuse into a later-formed channel polysilicon while the tungsten silicide provides for electrical conduction of the circuit. However, this stack may present operational problems. For example, the WSix film often has poor adhesion with underlying oxide layers. There is also a native oxide, such as the dielectric material layer 203, that frequently forms between the source material layer 201 (e.g., WSix) and the source polysilicon layer 205. Typically, the source material layer 201 also depletes at least some of the dopants added during the doping process 210.

Figure 2B:
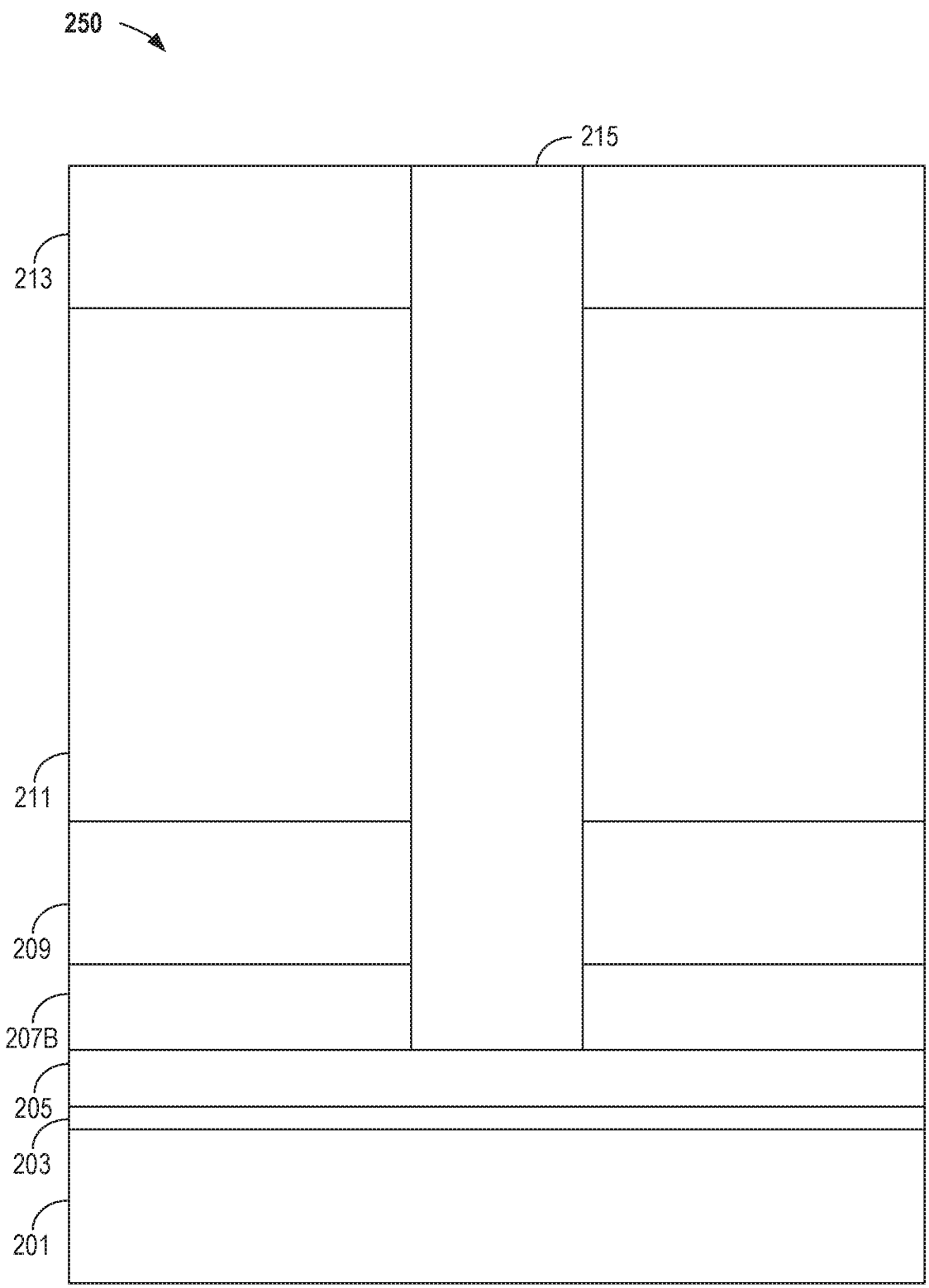

With reference now to FIG. 2B, a continuing example of a cross-sectional diagram 250 of prior art memory cell stack formation and associated source and channel structures are shown. The cross-sectional diagram 250 builds on the discussion provided above with reference to FIG. 2A.

FIG. 2B is shown additionally to include a second polysilicon layer 209, tier layers 211, a second dielectric layer 213, and a channel material 215. An opened capping material layer 207B, which is a version of the capping material layer 207A of FIG. 2A, is now formed (e.g., etched) to have an opening to accept the channel material 215.

Regarding the tier layers, 211, to meet the demand for even higher capacity memories, designers continue to strive for increasing memory density, i.e., the number of memory cells for a given area of an integrated circuit die. One way to increase the density of memory devices is to form stacked memory arrays, e.g., often referred to as three-dimensional memory arrays that include tiers of materials. For example, one type of three-dimensional memory array may include stacked memory cells, e.g., substantially vertical strings of series coupled memory cells, such as substantially vertical NAND strings. For example, the memory cells at a common location (e.g., at a common vertical elevation) in the strings may form a tier of memory cells that may commonly be coupled to a common control gate.

In a specific example, the tier layers 211 are comprised of a number of levels of semiconductor material (e.g., silicon) and a number of levels of dielectric material (e.g., silicon dioxide). Each of the levels of the semiconductor material is separated from a respective adjacent one of the levels of the semiconductor material by at least a respective one of the levels of the dielectric material. Therefore, the tier layers 211 could be considered to be a multiple level structure.

The channel material 215 may be a semiconductor material. In one example, the channel material 215 is formed from a polysilicon material.

Figure 3:
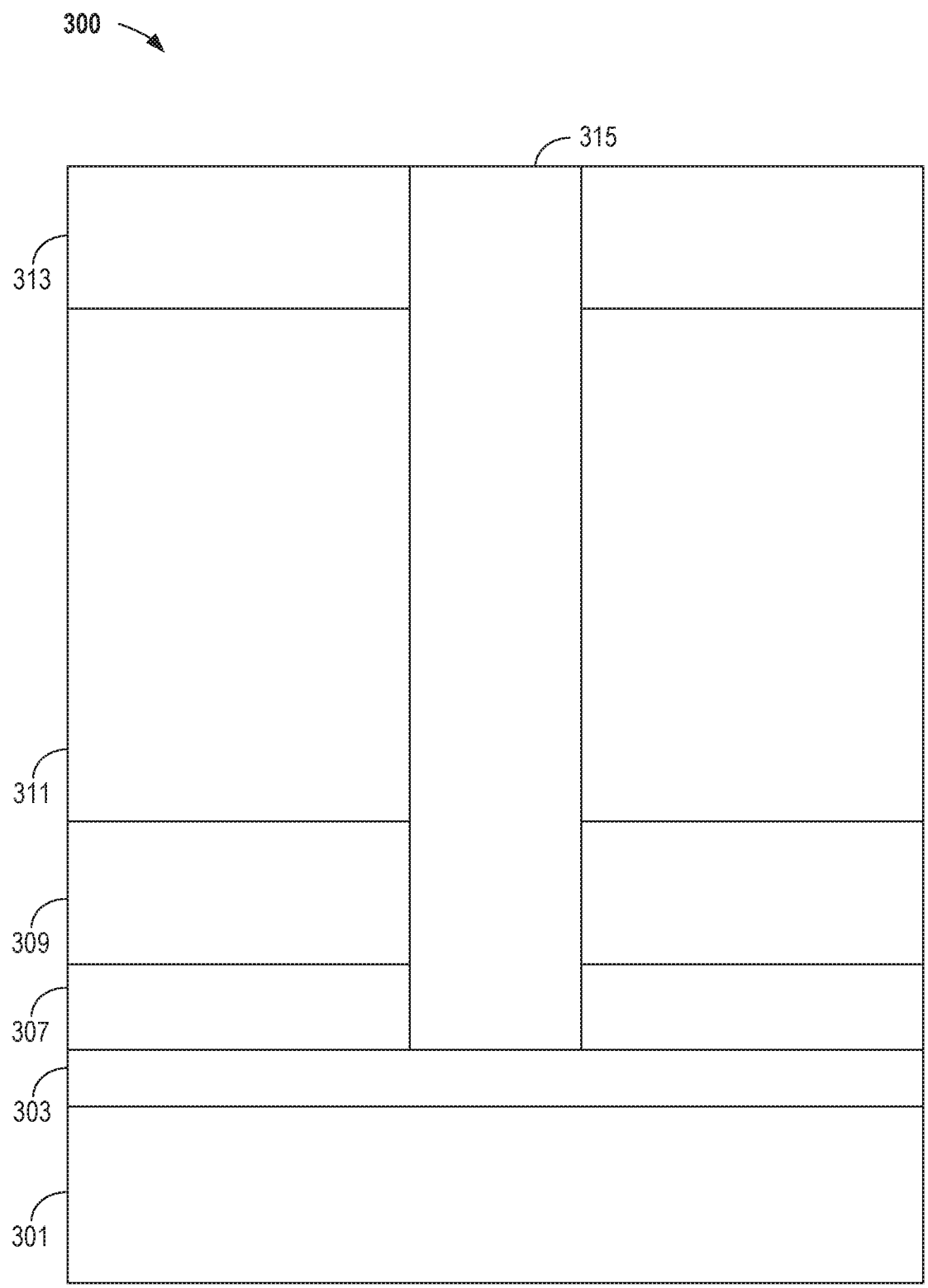
FIG. 3 shows an example of a cross-sectional diagram of a memory cell stack and an associated source and channel in accordance with various embodiments.

Referring now to FIG. 3, an example of a cross-sectional diagram 300 of a memory cell stack and an associated source and channel in accordance with various embodiments is shown. The cross-sectional diagram 300 is shown to include a TiN layer 301, a source polysilicon layer 303, a first dielectric layer 307, a second polysilicon layer 309, tier layers 311, a second dielectric layer 313, and a channel material 315.

Significantly, and in contrast with the prior art formation techniques of FIG. 2A and FIG. 2B, the source polysilicon layer 303 is in direct contact with the TiN layer 301 with no intervening dielectric or native oxide layer located between the source polysilicon layer 303 and the TiN layer 301. Additionally, in certain embodiments, the tier layers 311 may be comprised of a number of levels of a conductor material and a number of levels of dielectric material (e.g., silicon dioxide). Each of the levels of the conductor material is separated from a respective adjacent one of the levels of the conductor material by at least a respective one of the levels of the dielectric material (e.g., alternating levels of conductor material and dielectric material). In other embodiments, the tier layers 311 may be comprised of a number of levels of semiconductor material (e.g., silicon) and a number of levels of dielectric material (e.g., silicon dioxide). In this embodiment, each of the levels of the semiconductor material is separated from a respective adjacent one of the levels of the semiconductor material by at least a respective one of the levels of the dielectric material. Consequently, in various embodiments, the tier layers 311 may include a conductor material comprising, for example, conductively-doped polysilicon. In various embodiments, the tier layers 311 may include a conductor material comprising, for example, a metal. Further, as is discussed below with reference to FIG. 4, the source polysilicon layer 303 may be contacted from above by various metallic contacts and interconnects.

Consequently, as a result of the novel arrangement shown in FIG. 3, the source polysilicon layer 303 continues to provide a dopant reservoir for the channel material 315, as found in the prior art. However, the TiN layer 301 may be used as an electrical conductor, and, due to the chemical nature of TiN, no native oxide formation occurs between the source polysilicon layer 303 and the TiN layer 301. For example, a person of ordinary skill in the art will recognize that an aqueous-based or other cleaning procedure of a WSix layer (e.g., the source material layer 201 of FIGS. 2A and 2B) will lead to the formation of a native oxide (e.g., $WSiO_x$). However, due to the chemical nature of TiN, no native oxide is formed from TiN when the apparatus and methods described herein are implemented.

Further, the TiN layer 301 serves as a barrier to dopant diffusion to reduce or prevent the diffusion of dopant species from the source polysilicon layer 303. Compared with the resistivity of the WSix employed by prior art structures (where WSix typically has a resistivity of about 220 μOhm-cm), the TiN layer 301, in one embodiment, may have a resistivity range of about 60 μOhm-cm to about 100 μOhm-cm. In other embodiments, the TiN layer 301 may have a resistivity range of about 85 μOhm-cm to about 100 μOhm-cm. As a result of the lowered resistivity, there is less effect on the related circuitry from either line resistance and/or capacitance effects. Further, the TiN layer 301 has better adhesion with an underlying dielectric layer (e.g., oxide) that may be used to electrically isolate the TiN layer 301 from other devices in the circuit.

In some embodiments, the TiN layer 301 may be formed to have a thickness from about 100 Å to about 2000 Å. However, the TiN layer 301 can be thicker—although the deposition time increases. The source polysilicon layer 303 may be formed to also have a thickness from about 100 Å to about 2000 Å. In many embodiments, the source polysilicon layer 303 should be thick enough to provide a dopant reservoir for the channel material 315. However, in most embodiments, the source polysilicon layer 303 should not be so thick as to substantially affect an overall resistance level between the TiN layer 301 and the channel material 315. Based upon the disclosure provided herein, along with integrated circuit design techniques known in the art, a person of ordinary skill in the art will recognize how to determine these various thickness ranges to achieve the desired objectives.

In various embodiments, the layers may be formed using a variety of formation or deposition process tools (e.g., physical vapor deposition (PVD), chemical vapor deposition (CVD), plasma-enhanced CVD (PECVD), atomic level deposition (ALD)). In some embodiments, the source layer may be formed utilizing an Applied Materials® Cirrus™ TiN PVD process chamber (available from Applied Materials, Inc.™, 3050 Bowers Ave, Santa Clara, Calif., United States). Table I, below, illustrates characteristics (in terms of layer properties and associated values) for an example source layer (e.g., the TiN layer 301) discussed herein.

TABLE 1

| (approximate values given) | |
|---|---|
| Layer Properties | Value |
| Density [gm/cm$^3$] | 5.2 |
| Stress [MPa] | 300-500 |
| Rho [μOhm-cm] | 60-100 |
| Surface Roughness [nm] | 0.4-0.6 (measured at 2 μm × 2 μm area, 512 samples/scan length or spatial bandwidth of about 0.5 μm$^{-1}$ to about 38.0 μm$^{-1}$) |
| Ti:N Ratio | 1:1 |
| Crystal Texture | Substantially cubic TiN with strong {220} and {200} orientations |

Although specific values or ranges of values are given for each of the layer properties, these values are provided merely to aid the person of ordinary skill in the art in understanding certain characteristics of the source layer (e.g., the TiN layer 301) described herein. Those of ordinary skill in the art will realize, upon reading and understanding the disclosure provided herein, that these values are presented as examples only and numerous other values and ranges of values may be employed while still benefiting from the novel source layer discussed herein.

For example, various process tools that are capable of forming a low resistance TiN film may be utilized. In various embodiments, the process tools may form the low resistance film by using a high-pressure, high-radio frequency (high RF) plasma at slightly elevated temperatures. In some embodiments, the layer deposition temperature may be in the range of about 200° C. to 450° C., at a pressure of about 20 mTorr to 150 mTorr, at an RF frequency of about 40 MHz.

The layer surface roughness, along with the resistivity of the TiN layer 301, may be reduced to less than about 60

µOhm-cm for the latter, by using a combination of particular process conditions during deposition of the film. For example, by controlling the gas-phase deposition mixture composition, a quantity of the deposition mixture contacting the substrate surface over a given time period, and a pressure in the process vessel, the resistivity and surface roughness of the titanium nitride layer may be adjusted. The resistivity of the TiN layer 301 is principally determined by a crystal orientation of the titanium nitride material. That is, the more nearly the crystal orientation approaches 100% of the {200} orientation (the lower the percentage of {111} orientation), the lower the film resistivity). Crystal orientation is obtained by increasing an ionized content of the deposition mixture and by slowing the rate of deposition of the produced titanium nitride film. The surface roughness of the titanium nitride layer may be reduced by reducing the pressure in the process vessel, which affects the film formation dynamics. However, a person of ordinary skill in the art will understand that these values and orientations are provided as examples only to aid in understanding various embodiments described herein.

Figure 4:
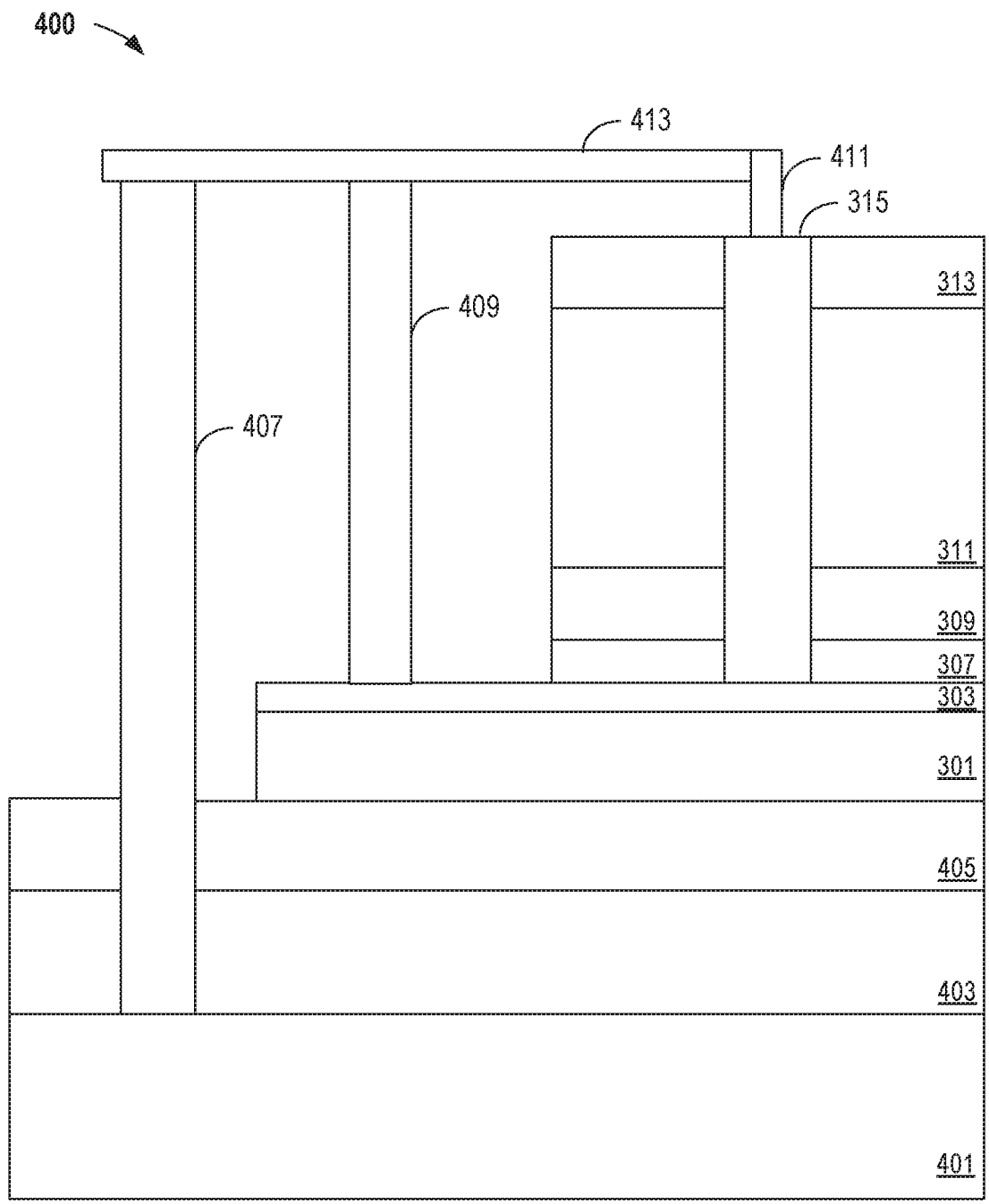
FIG. 4 shows an example of a cross-sectional diagram of the memory cell stack of FIG. 3, coupled to various peripheral support device layers and a substrate through metallization contacts and metallization routing in accordance with various embodiments.

With reference now to FIG. 4, an example of a cross-sectional diagram of the memory cell stack of FIG. 3, coupled to various peripheral support device layers and a substrate through metallization contacts and metallization routing, in accordance with various embodiments is shown. FIG. 4 is shown to include a substrate 401, a peripheral support device layer 403, a dielectric layer 405, a first metallization contact 407, a second metallization contact 409, a channel metallization contact 411, and a metallization routing interconnect 413.

In various embodiments, the substrate 401 can include, for example, any of various types of substrates used in the semiconductor and allied industries (which may be referred to herein as "semiconductor substrates" or simply "substrates"). Substrate types may therefore include silicon wafers, compound wafers, thin film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa. For ease of understanding the fabrication activities presented herein, the substrate 401 may be considered to be a silicon wafer. Upon reading and understanding the disclosure provided herein, a person of ordinary skill in the art will understand how to modify the fabrication activities to account for other types of materials and electronic devices.

The peripheral support device layer 403 may comprise any number of circuits, devices, or other peripheral devices. The devices may be encapsulated in a dielectric film. In one embodiment, the peripheral support device layer 403 may comprise a number of complementary metal-oxide-semiconductor (CMOS) gates. In other embodiments, the peripheral support device layer 403 may comprise other support circuitry such as timers or sense amplifiers. The first metallization contact 407 may or may not be electrically coupled to any of the circuits or devices in the peripheral support device layer 403.

The dielectric layer 405 may comprise various types of dielectric material such as, for example, silicon dioxide ($SiO_2$) to electrically isolate the peripheral support device layer 403 from the TiN layer 301. However, a person of ordinary skill in the art, upon reading the disclosure provided herein, will recognize that materials other than silicon dioxide or other various types of insulating layers may be used to form the dielectric layer 405. For example, various types of dielectric materials, such as tantalum pentoxide ($Ta_2O_5$), silicon nitride ($Si_xN_y$), aluminum oxide ($Al_2O_3$), hafnium oxide ($HfO_2$), or a variety of other dielectric or ceramic materials may be used as an alternative to or in conjunction with the silicon dioxide or other type of insulating layer.

Each of the first metallization contact 407, the second metallization contact 409, the channel metallization contact 411, and the metallization routing interconnect 413 are formed from various conductive materials known independently in the art. Further, a person of ordinary skill in the art will understand, after reading the content of this disclosure that additional metal contacts and interconnects may be employed.

The channel material 315 is electrically coupled to the substrate 401 through the channel metallization contact 411, the metallization routing interconnect 413, and the first metallization contact 407. Generally, as found in the prior art, if TiN is deposited on a silicon substrate, $Si_3N_4$ (or, more generally, $Si_xN_y$) is created through the chemical interaction of TiN with Si. As is known to those of ordinary skill in the art, $Si_3N_4$ has a high resistance to the flow of electrons. Consequently, contrary to the disclosure provided herein, TiN is generally not used over Si to avoid this high resistance contact situation.

Although the subject matter has been described herein with regard to NAND memory devices for ease of understanding, the techniques and materials can also be applied readily to other types of electronic devices as well. For example, the described fabrication techniques, structures, materials, and architectures resulting therefrom can be extended to NOR devices, microcontroller devices, other memory types, general purpose logic, or a host of other apparatuses that utilize a source. Various three-dimensional devices, repeating devices (e.g., SRAM), transistors, standard CMOS logic, and so on may all benefit from application of the processes disclosed herein.

Figure 5:
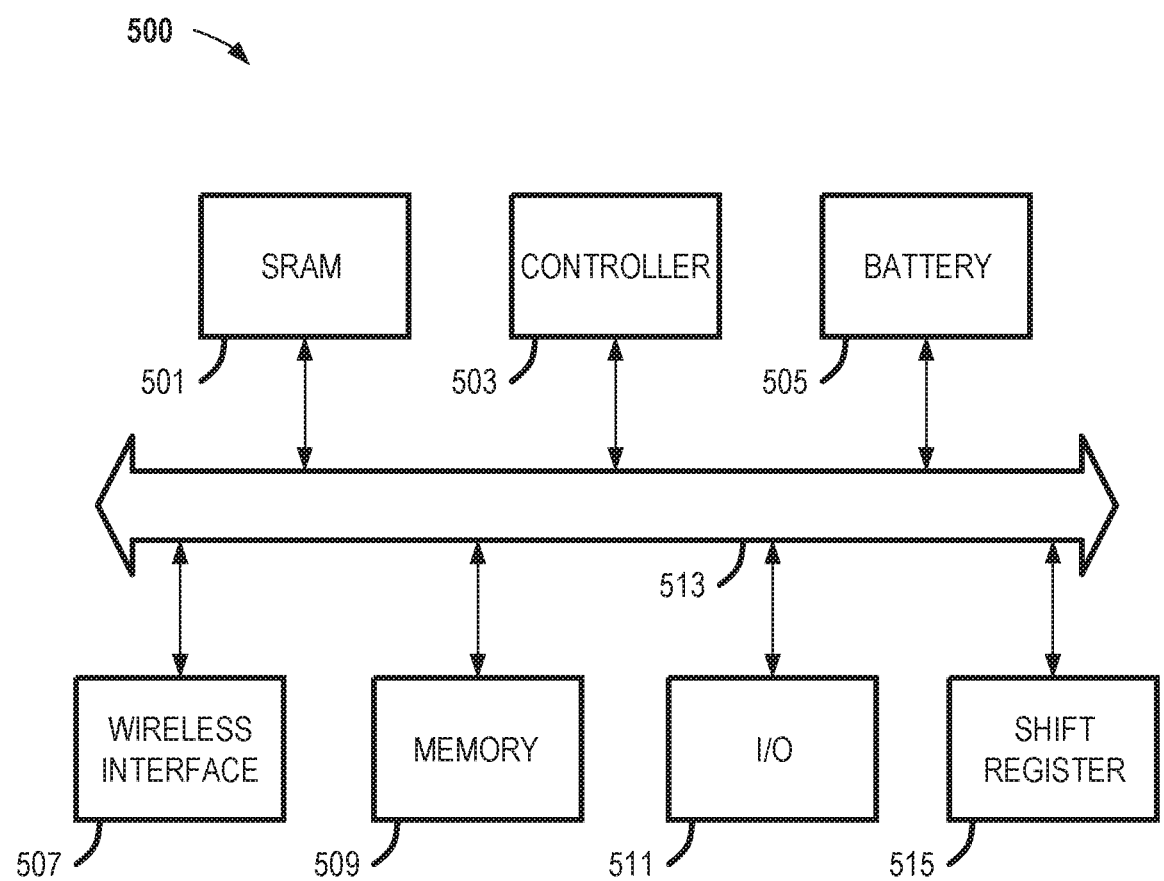
FIG. 5 shows an example of a block diagram of a system embodiment, including a memory device.

With reference now to FIG. 5, a block diagram of an illustrative embodiment of an apparatus in the form of a system 500 including one or more memory devices (e.g., the memory device of FIG. 1) is shown. The system 500 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 500 may be used in any of the following systems: a wireless local area network (WLAN) system, a wireless personal area network (WPAN) system, or a cellular network.

The system 500 of FIG. 5 is shown to include a controller 503, an input/output (I/O) device 515 (e.g., a keypad or a display), the memory device of FIG. 1, a wireless interface 511, and a static random access memory (SRAM) device 501 electrically coupled to each other via a bus 509. A battery 505 may supply power to the system 500 in one embodiment. The memory device may include a NAND memory, a flash memory, a NOR memory, a combination of these, or the like.

The controller 503 may include, for example, one or more microprocessors, digital signal processors, micro-controllers, or the like. The memory device may be used to store messages transmitted to or by the system 500. The memory device may optionally also be used to store instructions that are executed by the controller 503 during operation of the system 500 and may be used to store user data either generated, collected, or received by the system 500 (such as image data). The instructions may be stored as digital information and the user data, as disclosed herein, may be stored in one section of the memory as digital data and in another section as analog memory. As another example, a given section at one time may be labeled to store digital information and then later may be relabeled and reconfigured to store analog information.

The I/O device 515 may be used to generate a message. The system 500 may use the wireless interface 511 to transmit and receive messages to and from a wireless communication network with a radio frequency (RF) signal. Examples of the wireless interface 511 may include an antenna, or a wireless transceiver, such as a dipole antenna. However, the scope of the inventive subject matter is not limited in this respect. Also, the I/O device 515 may deliver a voltage reflecting what is stored as either a digital signal (if digital information was stored), or as an analog signal (if analog information was stored). While an example in a wireless application is provided above, embodiments of the inventive subject matter disclosed herein may also be used in non-wireless applications as well.

The various illustrations of the apparatus (e.g., the memory device of FIG. 1 and examples of the various fabrication stages illustrated with reference FIGS. 3 and 4) are intended to provide a general understanding of the structure of various embodiments and are not intended to provide a complete description of all the elements and features of the apparatus that might make use of the structures, features, and materials described herein.

The apparatus of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

One skilled in the art will appreciate that, for this and other methods and processes disclosed herein, the methods and processes may be implemented in a differing order. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. For example, instead of floating gate flash memory devices, charge trap memory devices may be used. Many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
multiple levels of alternating conductor material and dielectric material, with memory cells formed at least partially within the alternating levels of conductor material;
semiconductor material extending vertically through the multiple alternating levels of conductor material and dielectric material and adjacent vertically spaced memory cells to provide a channel for vertically adjacent memory cells, forming a vertical string of memory cells;
a source including a titanium nitride material, and source polysilicon having a first side coupled directly to the semiconductor channel material, and having a second side opposite the first side that is directly coupled to the titanium nitride material.

2. The apparatus of claim 1, wherein the titanium nitride material has a resistivity in the range of about 60 µOhm-cm to about 100 µOhm-cm.

3. The apparatus of claim 1, wherein the titanium nitride material has a resistivity in the range of about 85 µOhm-cm to about 100 µOhm-cm.

4. The apparatus of claim 1, wherein the titanium nitride material has a thickness range from about 100 Å to about 2000 Å.

5. The apparatus of claim 1, wherein the source polysilicon material has a thickness range from about 100 Å to about 2000 Å.

6. The apparatus of claim 1, wherein the titanium nitride material has a surface roughness range of about 0.4 nm to about 0.6 nm when measured at a spatial bandwidth of about 0.5 µm$^{-1}$ to about 38.0 µm$^{-1}$.

7. The apparatus of claim 1, wherein the titanium nitride material has a titanium-to-nitrogen ratio of approximately one-to-one.

8. The apparatus of claim 1, wherein the titanium nitride material has a substantially cubic titanium nitride crystal structure with a {220} orientation.

9. The apparatus of claim 1, wherein the titanium nitride material has a substantially cubic titanium nitride crystal structure with a {200} orientation.

10. The apparatus of claim 1, wherein the titanium nitride material is a barrier for dopant migration from the source polysilicon.

11. A memory structure, comprising:

titanium nitride source material;

source polysilicon material extending above the titanium nitride source material, the source polysilicon material having a first side directly coupled to the titanium nitride source material, and having a second side opposite the first side; and multiple strings of memory cells over the second side of the source polysilicon material, the string of memory cells having a semiconductor material forming a channel for the string of memory cells, the semiconductor channel material formed directly on the second side of the source polysilicon material.

12. The memory structure of claim 11, wherein the titanium nitride material acts as a barrier for dopant migration from the source polysilicon material.

13. The memory structure of claim 11, wherein the titanium nitride source material has a surface roughness range of about 0.4 nm to about 0.6 nm when measured at a spatial bandwidth of about 0.5 $\mu m^{-1}$ to about 38.0 $\mu m^{-1}$.

14. The memory structure claim 11, wherein the titanium nitride source material has a titanium-to-nitrogen ratio of approximately one-to-one.

15. The memory structure of claim 11, wherein the titanium nitride source material has a substantially cubic titanium nitride crystal structure with a {220} orientation.

16. The memory structure of claim 11, wherein the titanium nitride source material has a substantially cubic titanium nitride crystal structure with a {200} orientation.

17. The memory structure of claim 11, wherein the source polysilicon material provides a dopant reservoir for the semiconductor channel material.

18. A memory device, comprising:

multiple levels of alternating conductor material and dielectric material extending above a source, with memory cells formed at least partially within the alternating levels of conductor material;

semiconductor material extending vertically through the multiple alternating levels of conductor material and dielectric material and adjacent vertically spaced memory cells to provide a channel for vertically adjacent memory cells, forming a vertical string of memory cells;

the source including a titanium nitride material and source polysilicon material, the source polysilicon material extending above the titanium nitride material and having a first side directly coupled to the titanium nitride material, the source polysilicon material having a second side opposite the first side and directly contacting the semiconductor channel material.

19. The memory device of claim 18, wherein the source polysilicon is configured to serve as a dopant reservoir for the semiconductor channel material.

* * * * *